(12) United States Patent
Veh

(10) Patent No.: US 7,391,617 B2
(45) Date of Patent: Jun. 24, 2008

(54) COOLING ARRANGEMENT FOR A COMPUTER SYSTEM

(75) Inventor: Günther Veh, Hiltenfingen (DE)

(73) Assignee: Fujitsu Siemens Computers GmbH, Munich (DE)

( * ) Notice: Subject to any disclaimer, the term of this patent is extended or adjusted under 35 U.S.C. 154(b) by 0 days.

(21) Appl. No.: 11/487,584

(22) Filed: Jul. 17, 2006

(65) Prior Publication Data

US 2007/0019381 A1 Jan. 25, 2007

(30) Foreign Application Priority Data

Jul. 15, 2005 (DE) ...................... 10 2005 033 249

(51) Int. Cl.
*H05K 7/20* (2006.01)
*F28D 15/00* (2006.01)

(52) U.S. Cl. ...................... 361/719; 361/701; 361/704; 361/709; 165/104.33; 165/185; 174/16.3

(58) Field of Classification Search ................ 361/695, 361/704, 709–710, 719, 701; 165/80.3, 104.33, 165/185; 174/16.3
See application file for complete search history.

(56) References Cited

U.S. PATENT DOCUMENTS 5,473,510 A * 12/1995 Dozier, II ................... 361/719
6,331,937 B1 * 12/2001 Bartyzel ..................... 361/687
6,456,490 B1 * 9/2002 Lai .............................. 361/684
6,469,893 B1 * 10/2002 Frutschy et al. ............. 361/700
6,501,658 B2 * 12/2002 Pearson et al. .............. 361/709
6,611,431 B1 * 8/2003 Lee et al. ..................... 361/719
6,885,557 B2 * 4/2005 Unrein ......................... 361/704
7,095,614 B2 * 8/2006 Goldmann ................... 361/704
7,142,427 B2 * 11/2006 Reents ......................... 361/704
7,209,354 B2 * 4/2007 Wu et al. ..................... 361/697
7,239,516 B2 * 7/2007 Long et al. ................... 361/704
7,262,969 B2 * 8/2007 Lee et al. ..................... 361/704
2004/0109301 A1 6/2004 Shih-Tsung
2004/0247925 A1 * 12/2004 Cromwell .................... 428/548
2007/0047211 A1 * 3/2007 Refai-Ahmed et al. ...... 361/720

FOREIGN PATENT DOCUMENTS

GB 2402555 A 12/2004
WO WO 02/27785 A2 4/2002

* cited by examiner

*Primary Examiner*—Jayprakash N Gandhi
*Assistant Examiner*—Robert J Hoffberg
(74) *Attorney, Agent, or Firm*—Edell, Shapiro & Finnan, LLC

(57) ABSTRACT

A cooling arrangement for a computer system includes a base plate, a system board which coupled to the base plate, a processor arranged on the system board, and a cooling apparatus arranged on the processor. A holding plate is provided between the base plate and the system board in the region of the processor, and the cooling apparatus is connected, via connectors, to the holding plate such that the cooling apparatus can move relative to the holding plate.

8 Claims, 4 Drawing Sheets

COOLING ARRANGEMENT FOR A COMPUTER SYSTEM

CROSS REFERENCE TO RELATED APPLICATIONS

This application claims priority under 35 U.S.C. §§119 and/or 365 to Application No. DE 102005033249.8 filed on Jul. 15, 2005, entitled "Cooling Arrangement for a Computer System," the entire contents of which are hereby incorporated by reference.

FIELD OF THE INVENTION

The invention relates to a cooling arrangement for a computer system, the cooling arrangement including a base plate, a system board which is arranged on the base plate, a processor which is arranged on the system board, and a cooling apparatus which is arranged on the processor.

BACKGROUND

Cooling arrangements comprising a base plate, a system board, a processor and a cooling apparatus are widely known. Relatively low-power processors can still be cooled using a passive heat sink which is mounted on the processor itself. However, modern very powerful processors generate much more heat. Active cooling apparatus, e.g., heat sinks, which have fans permanently mounted on them, are therefore generally used for cooling such powerful processors. Other types of cooling are also known, for example the use of water coolers or heat pipes in conjunction with separate heat sinks.

As a result of the increasing power and importance of the cooling apparatus used, the fastening of such cooling apparatus is also becoming increasingly important. Cooling apparatus are generally fastened directly to a system board, typically via fastening lugs on the side of a processor base. As a result of such rigid fastening, applied forces create a shearing strain between the cooling apparatus and the system board. This has the disadvantage that forces which act on heavy cooling apparatus during transport, e.g., may be translated to the system board causing serious damage. In addition, it is possible for particularly heavy cooling apparatus to become detached from the processor base. This may result, for example, in short circuits within the computer or else may damage the processor. Even if the computer is still ready to use after the cooling apparatus has become detached, the processor may be destroyed, e.g., as a result of thermal overloading.

In order to limit the weight of cooling apparatus which are used, it is known to provide relatively small heat sinks with particularly powerful fans so that the air flow and thus the cooling power are increased while the heat sink surface area remains the same. However, this has the disadvantage that fans which rotate at high speed generally give rise to a high level of noise which is disruptive to a user of the computer.

SUMMARY

According to the invention, a cooling arrangement having a holding plate that is provided between the base plate and the system board in the region of the processor and the cooling apparatus is connected, via connectors, to the holding plate such that the cooling apparatus can move relative to the holding plate.

The inventive use of a holding plate between the base plate and the system board makes it possible for forces to be directly transmitted from the cooling apparatus to the base plate of the computer system. No forces or at least only greatly reduced forces thus act on the processor or the system board, with the result that the latter cannot be damaged by the cooling apparatus. In order to further reduce the forces which occur, in particular when transporting the computer and the acceleration forces which thus occur on particularly heavy or tall cooling apparatus, the cooling apparatus is connected, via connectors, to the holding plate such that it can move. Instead of high holding forces being directly transmitted from the cooling apparatus to the holding plate or the system board, the associated energy is converted, according to the invention, into a tilting movement of the cooling apparatus.

In one refinement of the invention, a cooling apparatus is fastened to a holding plate via fastening bolts having a thread stop function and spiral compression springs. The holding plate ensures that the system board cannot bend convexly even when relatively high forces act on the cooling apparatus. When particularly high acceleration forces occur, the cooling apparatus tilts, via the fastening bolts, toward the acting springs and is then returned to the initial position as a result of the opposing spring forces. This dynamic suspension avoids the processor being damaged by high forces which occur.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
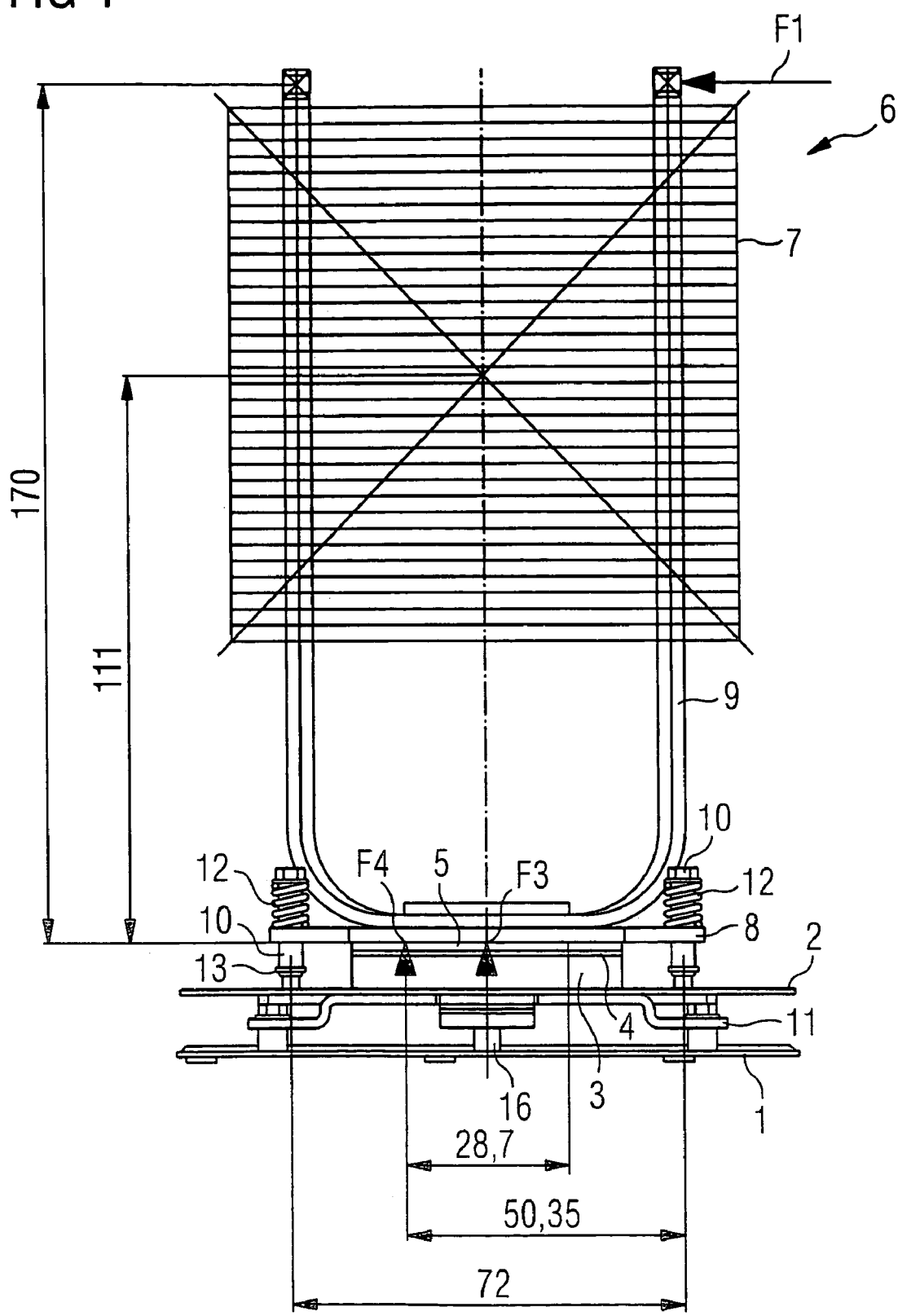
FIG. 1 shows a cross section through an inventive cooling arrangement.

FIG. 1 shows an inventive cooling arrangement. A system board 2 is arranged on a base plate 1. The system board 2 bears a processor 4 which is held via a processor base 3 in the exemplary embodiment. The processor 4 has a contact area 5 which is used to collect the heat which is produced in the processor 4 and to provide it to a cooling apparatus 6.

In the exemplary embodiment shown, the cooling apparatus 6 comprises a heat exchanger 7, a contact plate 8 and heat pipes 9 for transmitting thermal energy from the contact plate 8 to the heat exchanger 7. In order to optimize the amount of heat which is emitted by the heat exchanger 7, the latter is at a distance from the heat source to be cooled, in this case the processor 4. In the exemplary embodiment, the heat exchanger 7 is constructed from a particularly light material, for example aluminum, and a material having a high thermal conductivity, for instance copper, is used for the contact plate 8 and the heat pipes 9.

The cooling apparatus 6 is held, via screws 10, on a holding plate 11 which is arranged between the base plate 1 and the system board 2. In this case, springs 12 press the contact plate 8 against the contact area 5 of the processor 4.

Adapting the spring strength of the springs 12 makes it possible to set the pressure with which the contact plate 8 is pressed onto the contact area 5 of the processor 4. This makes it possible to ensure reliable heat transfer from the contact area 5 to the cooling apparatus 6 without transmitting the entire holding force needed for the cooling apparatus 6 to the processor 4 or the system board 2. Since the contact plate 8 is connected to the holding plate 11 via the screws 10, forces may instead be transmitted to the base plate 1 of the computer system via the holding plate 11.

If particularly high forces, for example acceleration forces, which act on the cooling apparatus 6 occur when the computer system is being transported, the forces are not completely transmitted to the holding plate 11 via the screws 10 but rather are converted into a tilting movement of the cooling apparatus 6 via the springs 12. That is, the springs function like a shock absorber and absorb at least a portion of the externally applied force, and allows the cooling apparatus to rotate or deflect relative to an axis orthogonal to the plane of the holding plate. While springs are used to absorb force in the exemplary embodiment described, other resilient or force absorbing members can be used. In order to avoid damage to the processor 4 and the system board 2 as a result of excessive tilting of the contact plate 8, first stop points 13 which are used to stop the tilting movement of the cooling apparatus 6 are provided on the screws 10.

Furthermore, a spacer 16 which prevents excessive convex bending of the system board 2 and thus damage to the soldered connections fitted on the latter is arranged between the base plate 1 and the system board 2.

Figure 2:
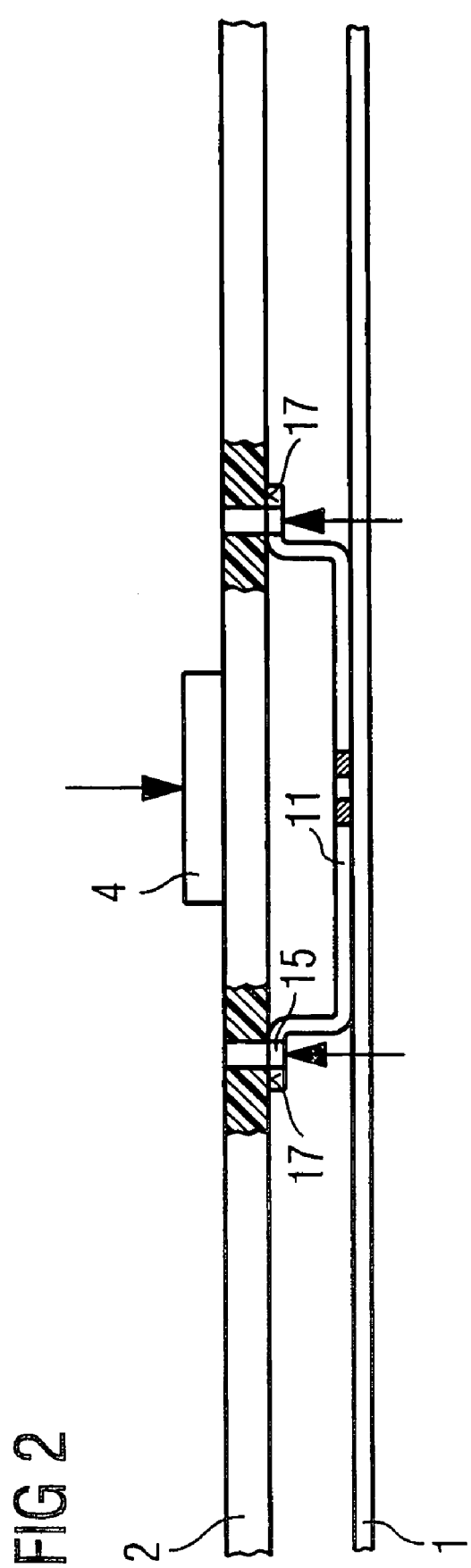
FIG. 2 shows a cross section through a holding plate of the inventive cooling arrangement.
Figure 3:
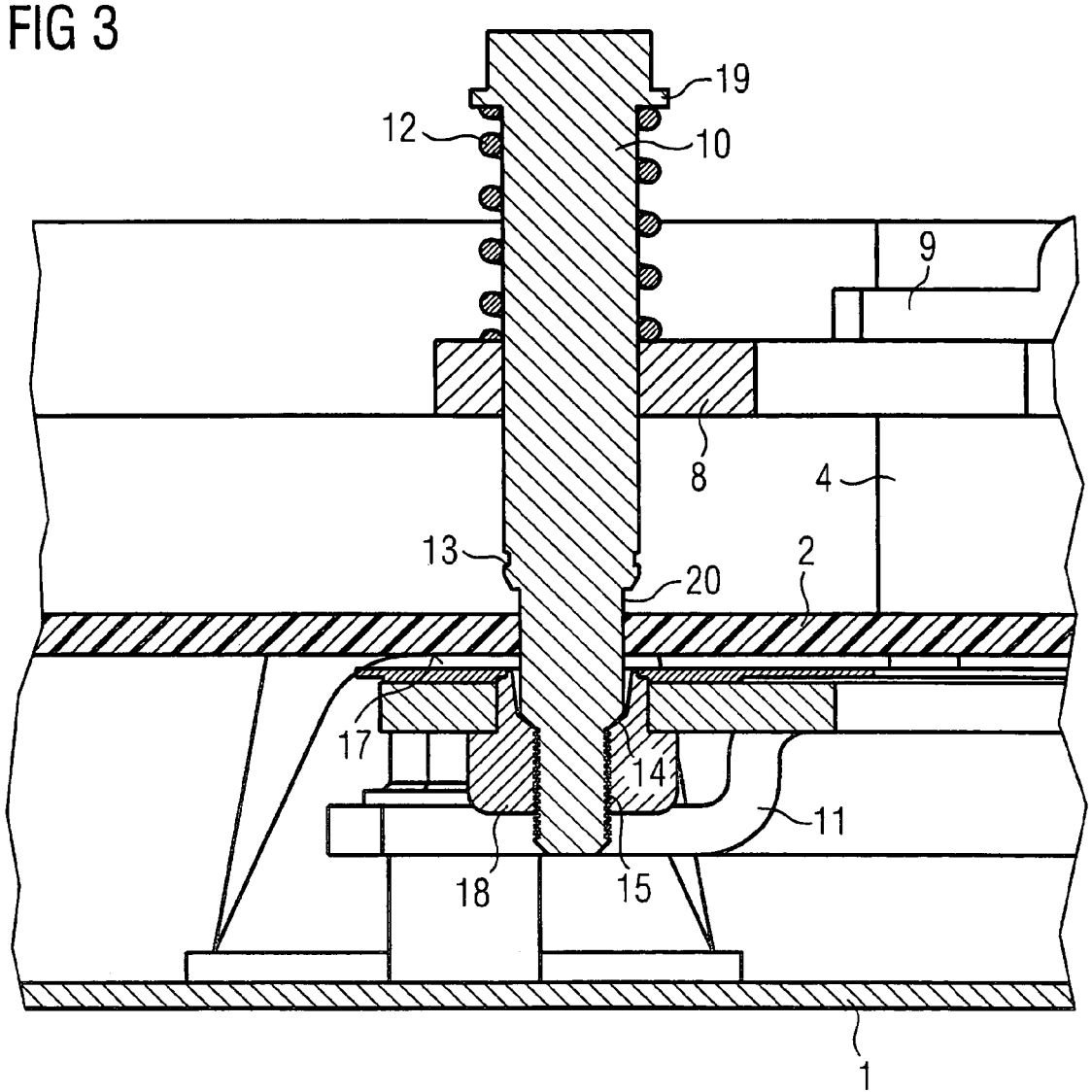
FIG. 3 shows an enlarged cross section through a screw fastening of the inventive cooling arrangement.
Figure 4:
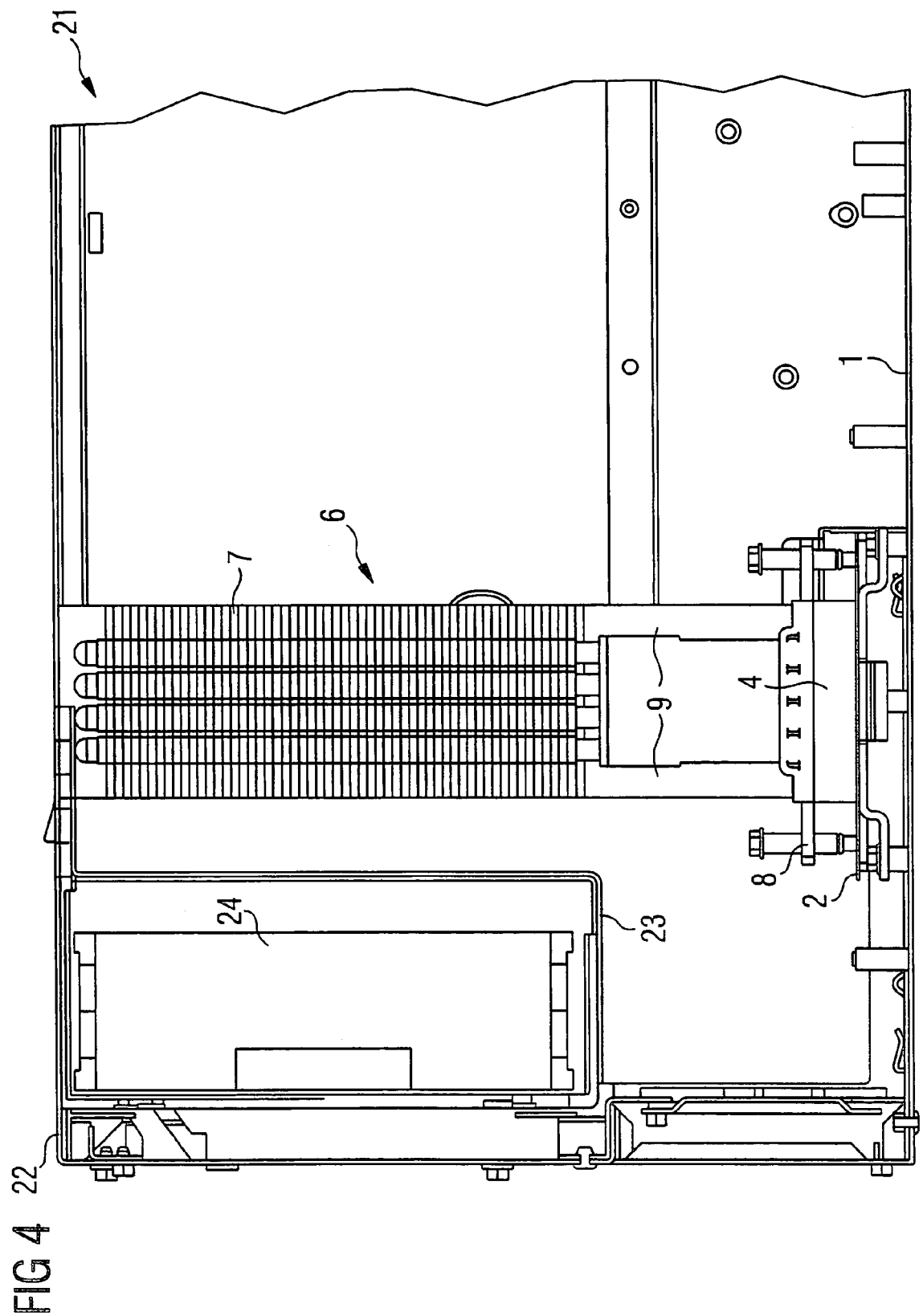
FIG. 4 shows a cross section through a computer system having an inventive cooling arrangement.

FIG. 2 shows another embodiment in which a cross section through the holding plate 11 (which is provided according to the invention) of the cooling arrangement. The holding plate 11 rests over a large area, with the result that forces, which are transmitted via screws 10, can be transmitted over a large area to the base plate 1. To this end, the holding plate 11 may be screwed or latched to the base plate 1, for example. Alternatively, as shown in FIGS. 1, 3, and 4, the holding plate 11 may also rest on the spacer 16 or be fastened using the latter. It goes without saying that the holding plate 11 may also be integrated with the spacer 16.

In order to ensure that the cooling apparatus 6 is securely fastened to the holding plate 11, the holding plate 11 has threaded holes 15. In this case, the processor 4 is arranged in a region of the system board 2 which is situated between the bearing areas 17 of the holding plate 11, with the result that the system board 2 can bend slightly concavely in the region of the processor.

FIG. 3 shows an enlarged cross section through one of the screw fastenings of the inventive cooling arrangement. One possible refinement of the screw 10 can be seen in this figure. In the upper region of the screw 10, the spring 12 acts between the screw head 19 and the contact plate 8. According to the invention, the contact plate 8 may move both up and down in order to allow a tilting movement of the cooling apparatus 6. The tilting movement is limited, toward the top, by the screw head 19 and, toward the bottom, by the first stop point 13 which is in the form of a groove in this case.

The system board 2 may also be slightly deflected between the bearing area 17 and a taper 20 of the screw 10. In contrast to conventional cooling arrangements, forces are not directly transmitted from the cooling apparatus 6 to the system board 2 and critical uncontrolled tensile stresses within the system board are thus avoided to the greatest possible extent.

In order to accurately position the screw 10 and thus the first stop point 13 and the taper 20, the screw 10 has a second stop point 14 which effects a thread stop function together with a screw chuck 18. The screw chuck 18 also makes it possible for the threaded hole 15 to be extended in order to reliably transmit high forces to the holding plate 11.

The inventive cooling arrangement is particularly suitable for computer systems which have a processor in accordance with the Intel LGA 775 standard. The forces which act between the processor 4 and the processor base 3 are particularly important in this type of processor. This is because, unlike in conventional processor bases, signal transmission between the base 3 and the processor 4 is ensured exclusively via the force with which the processor 4 is pressed into the base 3. To this end, processor bases 3 according to the Intel LGA 775 standard provide a holding apparatus which securely holds the processor 4 in the processor base 3 even when no cooling apparatus 6 is mounted above the processor 4.

Since both the processors 4 and the processor bases 3 according to this standard are relatively sensitive in mechanical terms, it is important that a maximum pressing force of a cooling apparatus 6 with respect to a contact area 5 of the processor 4 is not exceeded. The use of suitable springs 12 makes it possible to set the requisite pressing force for reliably transferring heat from the contact area 5 to the contact plate 8 without damaging the processor 4 as a result. At the same time, the holding plate 11 and the spacer 16 ensure that the system board 12 cannot bend convexly even if a particularly heavy cooling apparatus 6 is mounted on the processor 4.

According to the Intel specification, the problem is circumvented by limiting the mass of the heat sink. However, this has the disadvantage that a fan which operates at particularly high speed generally needs to be used to cool the processor 4 in particularly powerful processors 4. The use of powerful but large-area cooling apparatuses 6, such as the system which is shown in the exemplary embodiment, is based on a heat pipe, manages without active cooling elements and thus does not produce any disruptive noise in the computer, is virtually excluded by this standard. That is, a passive cooling element that does not require power or a built-in fan can be used.

This is because the heat sink 7 which is arranged at a distance from the processor 4 can exert high forces even when the mass of the heat sink 7 is low as a result of the lever which is provided by the heat pipes 9. This applies, in particular, when the system board 2 is arranged such that it is upright in a computer system, with the result that the gravitational force acts on the cooling apparatus in a manner parallel to the system board 2. This results in single-sided loading on the lower edge of the processor 4.

Nevertheless, the inventive arrangement and fastening of the cooling apparatus 6 makes it possible to mount a heavy or particularly tall cooling apparatus 6 on the processor 4 without allowing more than the maximum permitted bearing force to act on the contact area 5. Single-sided loading in the case of an upright arrangement may be compensated for in this case by the use of springs 12 having different spring strengths.

FIG. 4 shows a computer system 21 having a housing 22 with a built-in power supply 23. The power supply 23 has a fan 24 which supplies both the power supply and the housing interior with cooling air. The base plate 1 of the inventive fan arrangement corresponds to one of the sides of the housing 22 and bears the system board 2. A processor 4 which is cooled using the cooling apparatus 6 is arranged on the system board 2.

In the exemplary embodiment, the cooling apparatus 6 is a passive cooling apparatus comprising the contact plate 8, the heat pipes 9, and the heat sink 7. The heat sink 7 is at a distance from the processor 4 and is arranged in such a manner that is situated in the cooling air flow of the fan 24. A separate fan for cooling the processor 4 may thus be dispensed with. This has the advantage that additional production of noise is avoided.

The cooling apparatus 6 may also be arranged in such a manner that it is supplied with cooling air by other housing fans 24 which already exist or are additional.

Having described embodiments of a cooling arrangement for a computer system, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

1 Base plate
2 System board
3 Processor base
4 Processor
5 Contact area
6 Cooling apparatus
7 Heat exchanger
8 Contact plate
9 Heat pipe
10 Screws
11 Holding plate
12 Spring
13 First stop point
14 Second stop point
15 Threaded hole
16 Spacer
17 Bearing area
18 Screw chuck
19 Screw head
20 Taper
21 Computer system
22 Housing
23 Power supply
24 Fan

What is claimed is:

1. A cooling arrangement for a computer system, comprising:
    a base plate;
    a system board coupled to the base plate;
    a processor arranged on the system board;
    at least one spacer arranged between the base plate and the system board, the at least one spacer limiting convex bending of the system board;
    a cooling apparatus coupled to the processor; and
    a holding plate disposed between the base plate and the system board in a region of the processor for directly transmitting forces from the cooling arrangement to the base plate, wherein the cooling apparatus is coupled to the holding plate via connectors such that the cooling apparatus is moveable with respect to the holding plate, the connectors comprising spring elements that enable the cooling apparatus to tilt away from and return to a resting position thereby allowing heat to continue to be transferred from the processor to the cooling apparatus, and the connectors further comprising a first bearing point that limits the tilting movement of the cooling apparatus such that damage to the processor or the system board, in response to the cooling apparatus being deflected, is prevented.

2. The cooling arrangement of claim 1, wherein the holding plate comprises threaded holes and the connectors are coupled to the holding plate via a screw connection.

3. The cooling arrangement of claim 2, wherein the connectors comprise a second bearing point that allows the connectors to be screwed into the threaded hole to the extent of the second bearing point.

4. The cooling arrangement of claim 1, wherein the cooling apparatus comprises a heat pipe.

5. The cooling arrangement of claim 1, wherein the cooling apparatus comprises:
    heat pipes; and
    a heat sink arranged at a distance from the processor via the heat pipes, wherein the heat pipes provide a lever by which the heat sink is capable of exerting force.

6. A computer system, comprising:
    a housing;
    a housing fan; and
    the cooling arrangement of claim 1,
    wherein the housing comprises the base plate and the cooling apparatus is arranged in the housing such that the air flow of the housing fan supplies cooling air to the cooling apparatus.

7. The computer system of claim 6, further comprising a power supply including a fan that is used as a housing fan.

8. The computer system of claim 6, wherein the cooling apparatus comprises:
    heat pipes; and
    a heat sink arranged at a distance from the processor via the heat pipes, wherein the heat pipes provide a lever by which the heat sink is capable of exerting force.

* * * * *